(12) United States Patent
Roth et al.

(10) Patent No.: US 10,756,035 B2
(45) Date of Patent: Aug. 25, 2020

(54) SEMICONDUCTOR DEVICE LOAD TERMINAL

(71) Applicant: Infineon Technologies AG, Neubiberg (DE)

(72) Inventors: Roman Roth, Sattendorf (AT); Wolfgang Wagner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 51 days.

(21) Appl. No.: 15/285,250

(22) Filed: Oct. 4, 2016

(65) Prior Publication Data
US 2017/0098620 A1 Apr. 6, 2017

(30) Foreign Application Priority Data
Oct. 5, 2015 (DE) .......................... 10 2015 219 183

(51) Int. Cl.
*H01L 23/00* (2006.01)

(52) U.S. Cl.
CPC .............. *H01L 24/05* (2013.01); *H01L 24/03* (2013.01); *H01L 24/48* (2013.01); *H01L 24/45* (2013.01); *H01L 24/85* (2013.01); *H01L 2224/0345* (2013.01); *H01L 2224/03462* (2013.01); *H01L 2224/03622* (2013.01); *H01L 2224/04042* (2013.01); *H01L 2224/0516* (2013.01); *H01L 2224/0566* (2013.01); *H01L 2224/05118* (2013.01); *H01L 2224/05139* (2013.01);

(Continued)

(58) Field of Classification Search
CPC .................... H01L 24/03; H01L 24/05; H01L 2224/05557; H01L 2224/04042; H01L 2224/05568; H01L 2224/05573
See application file for complete search history.

(56) References Cited

U.S. PATENT DOCUMENTS 3,921,200 A 11/1975 Pille
4,750,029 A * 6/1988 Futatsuka .............. H01B 1/026
257/670

(Continued)

FOREIGN PATENT DOCUMENTS

DE 10 2004 059 389 A1 6/2006
DE 10 2005 019 574 A1 11/2006

(Continued)

OTHER PUBLICATIONS

Office Action communication of the German Patent and Trademark Office for Appln. Ser. No. 102015219183.4, dated May 30, 2016.

*Primary Examiner* — Mark W Tornow
*Assistant Examiner* — Abbigale A Boyle
(74) *Attorney, Agent, or Firm* — Slater Matsil, LLP (57) ABSTRACT

A semiconductor device is presented. The semiconductor device comprises a semiconductor body coupled to a first load terminal and to a second load terminal and configured to carry a load current between the first load terminal and the second load terminal. The first load terminal comprises a contiguous metal layer coupled to the semiconductor body; and at least one metal island arranged on top of and in contact with the contiguous metal layer and configured to be contacted by an end of a bond wire and to receive at least a part of the load current by means of the bond wire, wherein the contiguous metal layer and the metal island are composed of the same metal.

19 Claims, 5 Drawing Sheets

(52) U.S. Cl.
CPC ............... *H01L 2224/05144* (2013.01); *H01L 2224/05147* (2013.01); *H01L 2224/05155* (2013.01); *H01L 2224/05164* (2013.01); *H01L 2224/05553* (2013.01); *H01L 2224/05555* (2013.01); *H01L 2224/05618* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/4502* (2013.01); *H01L 2224/45124* (2013.01); *H01L 2224/45139* (2013.01); *H01L 2224/45144* (2013.01); *H01L 2224/45147* (2013.01); *H01L 2224/4847* (2013.01); *H01L 2224/48091* (2013.01); *H01L 2224/48463* (2013.01); *H01L 2924/13055* (2013.01); *H01L 2924/13091* (2013.01)

(56) References Cited

U.S. PATENT DOCUMENTS

| | | | |
|---|---|---|---|
| 5,298,793 A | 3/1994 | Kotani | |
| 5,736,790 A * | 4/1998 | Iyogi | H01L 24/10 257/780 |
| 6,465,879 B1 * | 10/2002 | Taguchi | H01L 21/563 257/673 |
| 8,525,347 B2 * | 9/2013 | Barth | H01L 25/0657 257/620 |
| 2006/0071335 A1 * | 4/2006 | Kotaki | H01L 23/49582 257/750 |
| 2009/0079080 A1 * | 3/2009 | Stecher | H01L 21/2885 257/762 |
| 2010/0133688 A1 * | 6/2010 | Shigihara | H01L 24/46 257/738 |
| 2010/0186991 A1 | 7/2010 | Tajima et al. | |
| 2011/0298048 A1 | 12/2011 | Senoo et al. | |
| 2011/0309436 A1 | 12/2011 | Nakata | |
| 2014/0191418 A1 * | 7/2014 | Cheng | H01L 25/50 257/777 |
| 2015/0115391 A1 | 4/2015 | Roth et al. | |

FOREIGN PATENT DOCUMENTS

| | | | |
|---|---|---|---|
| DE | 112009004375 T5 | 5/2012 | |
| DE | 102012109995 A1 * | 4/2014 | ............ H01L 33/38 |
| DE | 102012109995 A1 | 4/2014 | |

* cited by examiner

SEMICONDUCTOR DEVICE LOAD TERMINAL

CROSS-REFERENCE TO RELATED APPLICATION

This application claims priority to German Application Serial No. 102015219183.4 filed Oct. 5, 2015 and entitled "Semiconductor Device Load Terminal".

TECHNICAL FIELD

This specification refers to embodiments of a semiconductor device, embodiments of a semiconductor module and to embodiments of a method of processing a semiconductor device. In particular, this specification refers to embodiments of a semiconductor device having a load terminal with reinforced bonding pads for attachment of bond wires, to embodiments of a corresponding semiconductor module and to embodiments of a corresponding method of processing a semiconductor device.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

Usually, a power semiconductor device comprises at least a first load terminal for receiving a load current and for coupling the load current into a semiconductor body of the power semiconductor device and a second load terminal for outputting the load current out of the semiconductor body, e.g., to an electrical load.

To this end, at least one of such two load terminals of a power semiconductor device can be connected to its packaging, e.g., during fabrication of the power semiconductor device by means of bonding, e.g., wire bonding.

For example, a bond wire is used for establishing a connection between at least one of the load terminals of the power semiconductor device and a terminal of a packaging of a semiconductor device.

SUMMARY

According to an embodiment, a semiconductor device is provided. The semiconductor device comprises a semiconductor body coupled to a first load terminal and to a second load terminal and configured to carry a load current between the first load terminal and the second load terminal. The first load terminal comprises a contiguous metal layer coupled to the semiconductor body and at least one metal island. The metal island is arranged on top of and in contact with the metal layer and configured to be contacted by an end of a bond wire and to receive at least a part of the load current by means of the bond wire. The contiguous metal layer and the metal island are composed of the same metal.

According to a further embodiment, a semiconductor module is provided. The semiconductor module comprises a packaging, at least one bond wire and a semiconductor device. The packaging surrounds the semiconductor device at least partially. The semiconductor device comprises a semiconductor body coupled to a first load terminal and to a second load terminal and configured to carry a load current between the first load terminal and the second load terminal. The first load terminal comprises a contiguous metal layer coupled to the semiconductor body and at least one metal island. The at least one metal island is arranged on top of and in contact with the metal layer and configured to be contacted by an end of the bond wire and to receive at least a part of the load current by means of the bond wire. The contiguous metal layer and the metal island are composed of the same metal. The packaging comprises a load current interface, wherein the load current interface is contacted by the other end of the bond wire.

According to another embodiment, a method of processing the semiconductor device is presented. The method comprises: Providing a semiconductor body having a surface and configured to conduct a load current; creating a first load terminal arranged on top of the surface of the semiconductor body and configured to receive the load current, wherein creating the first load terminal comprises: depositing a first material that includes a metal exhibiting a first level of impurity so as to form a contiguous metal layer coupled to the semiconductor body; and depositing a second material that includes the same metal exhibiting a second level of impurity so as to form at least one metal island on top of and in contact with the contiguous metal layer, wherein the at least one metal island is configured to be contacted by an end of a bond wire and to receive at least a part of the load current by means of the bond wire.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor region. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the vertical direction Z mentioned below may be a vertical direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

Specific embodiments described in this specification pertain to, without being limited thereto, a power semiconductor device that may be used within a power converter or a power supply. For example, the power semiconductor device may comprise one or more power semiconductor cells, such as a monolithically integrated diode cell, and/or a monolithically integrated transistor cell, and/or a monolithically integrated IGBT cell, and/or a monolithically integrated MOS Gated Diode (MGD) cell, and/or a monolithically integrated MOSFET cell and/or derivatives thereof. Such diode cells and such transistor cells may be integrated in a semiconductor module.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 150 V, e.g., 1200 V and above.

Figure 1:
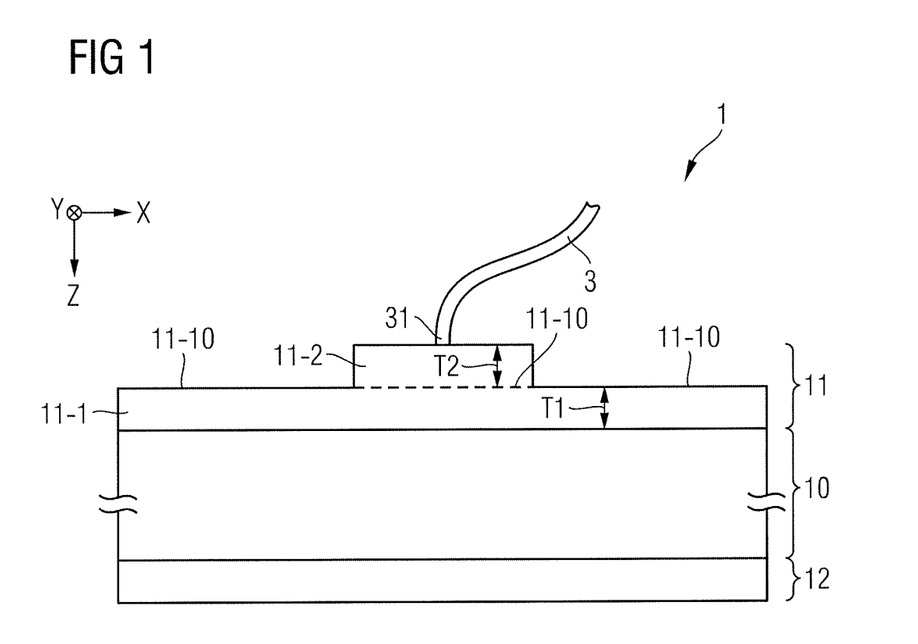
FIG. 1 schematically illustrates a section of a vertical cross-section of a semiconductor device in accordance with one or more embodiments.

FIG. 1 schematically illustrates a section of a vertical cross-section of a semiconductor device 1 in accordance with one or more embodiments. The semiconductor device 1 comprises a semiconductor body 10 that extends along a vertical direction Z, along a first lateral direction X and along a second lateral direction Y. FIG. 1 exemplarily shows a cross-section along the XZ-plane. For example, the semiconductor body 10 has a total extension along the vertical direction Z of no more than 700 µm.

The semiconductor body 10 can be configured to carry a load current between a first load terminal 11 and a second load terminal 12 of the semiconductor device 1. For example, the load current is received by means of the first load terminal 11 and output by the second load terminal 12 and/or vice versa.

For example, in order to be able to carry a load current, the semiconductor 10 may comprise one or more diode and/or transistor cells. Such cells are not illustrated in FIG. 1, since their exact design is presently of less importance. Rather, the semiconductor body 10 may exhibit principally any arbitrary transistor and/or diode structure that is nowadays and in the future used, including, but not limited to an IGBT, a MOSFET, a MOS gated diode, and/or a diode structure. To this end, the semiconductor body 10 may comprise one or more first regions having dopants of a first conductivity type and one or more second regions having dopants of a second conductivity type complementary to the first conductivity type For example, the second load terminal 12 may comprise a backside metallization that may be in electrical contact with sections of the semiconductor body 10, for example with a highly doped semiconductor contact layer (not illustrated).

The first load terminal 11 may be or form a part of a front side metallization of the semiconductor device 1. For example, the first load terminal 11 may form a part of a source contact structure, and the second load terminal 12 may form a part of a drain contact structure.

The first load terminal 11 may comprise a contiguous metal layer 11-1 that is coupled to the semiconductor body 10. For example, the contiguous metal layer 11-1 is electrically connected to at least a section of a semiconductor body 10, for example, to one or more source regions (not illustrated) of the semiconductor body 10, for example to $n^+$-regions and/or $p^+$-regions.

On top of and in contact with the contiguous metal layer 11-1, there is arranged at least one metal island 11-2. Although FIG. 1 only shows only one island 11-2, it shall be understood that a semiconductor device 1 may comprise a plurality of such a metal island 11-2. These islands may be arranged in accordance with the positions of said source regions. Thus, each of the islands may exhibit a common overlap along both lateral direction X and Y with a respective source region.

The metal island 11-2 is configured to be contacted by an end 31 of a bond wire 3 and to receive at least a part of the load current by means of the bond wire 3.

The material of the bond wire 3 may comprise at least one of aluminum, copper, silver and gold. The diameter of the bond wire 3 is, e.g., smaller than the diameter of the surface of the metal island 11-2. For example, a diameter of the surface of the metal island 11-2 is at least twice as large as the diameter of the first end 31 of the bond wire 3. A horizontal cross-section of the metal island 11-1 within the XY plane may exhibit the shape of, e.g., an ellipse, a rectangle or a circle.

For example, the end 31 of the bond wire 3 is fixed to the surface of the metal island 11-2 by means of bonding, such as ball bonding, wedge bonding and compliant bonding.

The contiguous metal layer 11-1 may be formed by carrying out a first lithography processing step using a first resist mask (not illustrated). The at least one metal island 11-2 may be formed by carrying out a second lithography processing step using a second resist mask (not illustrated)

In accordance with one or more embodiments, the contiguous metal layer 11-1 and the metal island 11-2 are composed of the same metal. For example, the contiguous metal layer 11-1 and the at least one metal island 11-2 form a monolithic metal region. Thus, for example, there is no intermediate element in between the contiguous metal layer 11-1 and the metal island 11-2.

It shall be understood that the contiguous metal layer 11-1 may comprise a stack of one or more sublayers (not illustrated) that include, e.g., a diffusion barrier layer. The contiguous metal layer 11-1, e.g., the lowest of the sublayers of the contiguous metal layer 11-1, may be in contact with the semiconductor body 10. Said lowest sublayer may be a diffusion barrier layer. On the other side, the top one of the one or more sublayers of the contiguous metal layer 11-1 may be in contact with the at least one metal island 11-2.

Regarding the materials of the contiguous metal layer 11-1 and the metal island 11-2, it shall be understood that the metal that is common in both the metal island 11-2 and the contiguous metal layer 11-1 may comprise at least one of copper, silver, gold, palladium, zinc, nickel, iron, and the like.

In accordance with one embodiment, the materials of the metal island 11-2 and the contiguous metal layer 11-1 are entirely identical to each other. In accordance with another embodiment, the metal present in the contiguous metal layer 11-1 comprises a first substance, when the first substance amounts to a material portion of at most 1% in the contiguous metal layer 11-1. Said material portion may be even significantly lower than 1%, for example 0.5%, lower than 0.1%, or even lower than 0.05%.

Further, the metal present in the at least one metal island 11-2 may comprise a second substance, wherein the second substance may amount to a material portion of at most 1% in the at least one metal island 11-2. Again, also the material portion of the second substance may be even significantly lower than 1%, e.g., lower than 0.5%, lower than 0.1%, or even lower than 0.05%.

In an embodiment, the first substance and the second substance may be different from each other. Thus, two metal alloys that are slightly different from each other can be used. In another embodiment, the first substance and the second substance may be identical to each other. Also, the material portions mentioned above may be identical to each other or different from each other. Then, the material of the metal island 11-2 and the material of the contiguous metal layer are identical to each other.

Thus, the metal present in the contiguous metal layer 11-1 may exhibit a first level of impurity, and the metal present in the at least one metal island 11-2 may exhibit a second level of impurity. Each of the first level of impurity and the second level of impurity may amount to, in accordance with an embodiment, at most 1%. The levels of impurity may be lower than 1%, for example lower than 0.5%, lower than 0.1%, or even lower than 0.05%. For example, both the first level of impurity and the second level of impurity are identical to each other.

In accordance with another embodiment, the first level of impurity is different from the second level of impurity.

For example, the metal present in the contiguous metal layer 11-1 is deposited from a first electrolyte in accordance with an electrochemical process. Further, the metal being present in the metal island 11-2 is deposited from a second electrolyte in accordance with an electrochemical process. The first and second electrolyte may be identical to each other. In accordance with another embodiment, the first and the second electrolyte may be different from each other.

In accordance with an embodiment, different levels of impurities may be used to establish different degrees of hardness within the metal island 11-2 and the contiguous metal layer 11-1. For example, the degree of hardness of the metal island 11-2 is greater than the degree of hardness of the contiguous metal layer 11-1.

For example, the metal island 11-2 establishes a mechanically reinforced region that allows for a stable mechanical and electrical connection to the end 31 of the bond wire 3. In other words, the metal island 11-2 may form a bonding pad.

Regarding spatial dimensions, the contiguous metal layer 11-1 may exhibit a thickness T1 of at least 10 µm along a vertical direction Z. For example, the thickness T1 is substantially constant at least along one of the first lateral direction X and the second lateral direction Y. For example, the thickness T1 is constant along both lateral directions X and Y, e.g., within the range of 3 to 30 µm.

The metal island 11-2 may exhibit a thickness T2 of at least 5 µm along the vertical direction Z. For example, the thickness T2 is substantially constant at least along one of the first lateral direction X and the second lateral direction Y. For example, the thickness T2 is constant along both lateral directions X and Y, e.g., within the range 5 to 70 µm.

In an embodiment, the thickness T1 of the contiguous metal layer 11-1 is constant along both lateral directions X and Y and amounts to 20 µm, and the thickness T2 of the at least one metal island 11-2 is constant along both lateral directions X and Y and amounts to 10 µm.

Thus, the first load terminal 11 may exhibit at least one region that has a locally increased metal thickness. Said region may form a bonding pad having a total metal thickness of T1+T2.

For example, the metal island 11-2 extends for at least 5 µm and for at most 15 µm along the first lateral direction X, and for at least 5 µm and for at most 15 µm along the second lateral direction Y. Depending on the size of the end 31 of the bond wire 3, the lateral extensions of the metal island 11-2 can also be greater. For example, the metal island 11-2 extends for at least 100 µm, and for at least 100 µm along the second lateral direction Y. Further, in an embodiment, the metal island 11-2 may extend for t most 10000 µm along the first lateral direction X, and for at most 2000 µm along the second lateral direction Y.

The contiguous metal layer 11-1 may exhibit lateral extensions greater than the lateral extensions of the metal island 11-2, e.g., such lateral extensions that are common for a chip front side metallization. For example, the contiguous metal layer 11-1 extends for at least 400 µm along the first lateral direction and for at least 400 µm along the second lateral direction Y.

Thus, the metal island 11-2 covers, in accordance with an embodiment, at least 5% and at most 60% of a surface 11-10 of the contiguous metal layer 11-1.

The semiconductor body 10 may have a total extension along the vertical direction Z of at least 10 µm. For example, the total extension along the vertical direction Z of the semiconductor body 10 amounts to no more than 700 µm.

Figure 3:
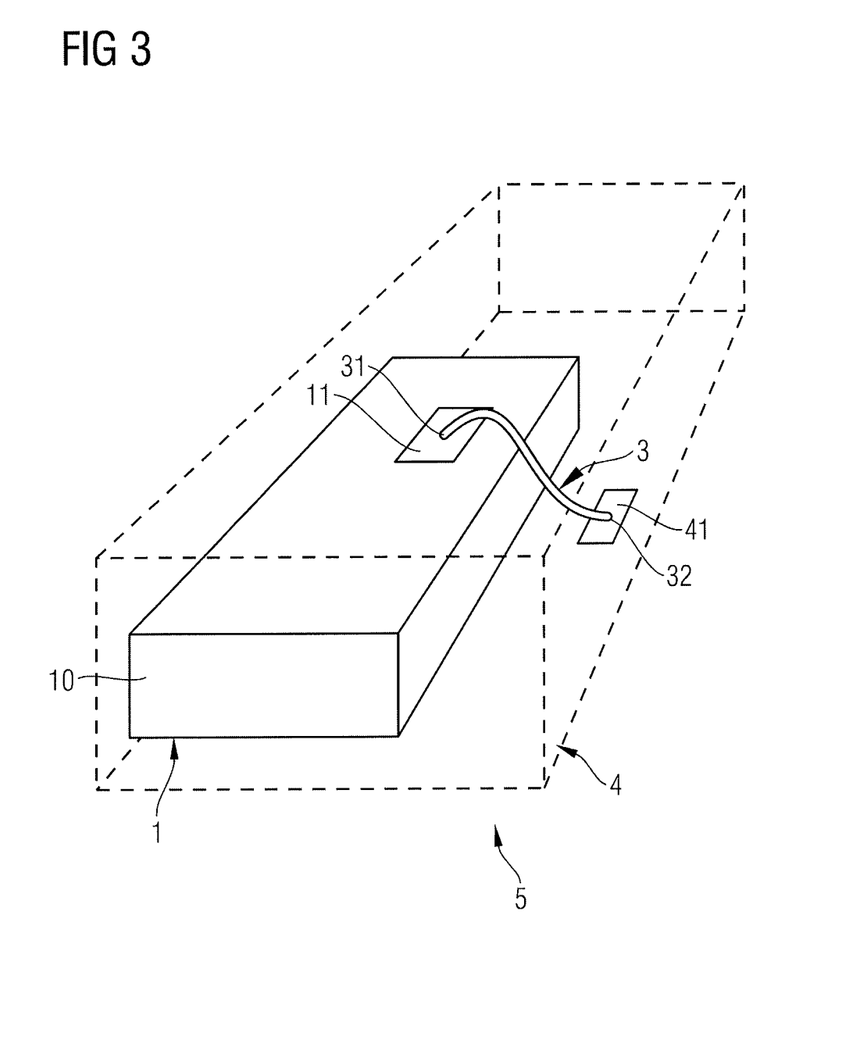
FIG. 3 schematically illustrates a perspective view on a semiconductor module in accordance with one or more embodiments.

FIG. 3 schematically illustrates a perspective view on a semiconductor module 5 in accordance with one or more embodiments. The semiconductor module 5 comprises a semiconductor device 1, for example, in accordance with the embodiments schematically illustrated and explained above with respect to FIG. 1. Further, the semiconductor module 5 may comprise a packaging 4 that at least partially surrounds the semiconductor device 1. For example, the packaging 4 comprises one or more external load interfaces and control interfaces (not illustrated) that can each be configured to be electrically connected to at least one of a gate driver, a power source, a load and a control means. Further, the packaging 4 may comprise one or more mechanical terminals (not illustrated) that allow for mechanically mounting the packaging 4, e.g., within a system rack or something alike. The packaging may comprise an electrically insulating material.

The packaging 4 may comprise a load current interface 41 that may be arranged internally of the packaging 4. Further, the semiconductor module 5 comprises a bond wire 3 that electrically connects the load current interface 41 to the first load terminal 11 of the semiconductor device 1, e.g., in a manner as explained above with respect to FIG. 1.

It shall be understood that the first load terminal 11 of the semiconductor device 1 of the embodiment of FIG. 3 can exhibit a design identical to the design exemplary explained above with respect to FIG. 1. Thus, the end 31 of the bond wire 3 can be attached to the metal island 11-2, whereas the other end 32 of the bond wire 3 is attached to the load current interface 41 of the packaging 4. It shall be understood that the semiconductor module 5 may certainly comprise more than only one bond wire 3, and that the semiconductor device 1 may certainly comprise more than only one metal island 11-2, wherein the other bond wires may also be used for electrically connecting the first load terminal 11 of the semiconductor device 1 to the load current interface 41 of the packaging 4. For example, the load current interface 41 of the packaging 4 is used for electrically connecting a Source of the semiconductor device to an external power supply or to an external electrical load. Each of the metal island 11-2 and the load current interface 41 may be present in the form of a bonding pad.

Figure 2A:
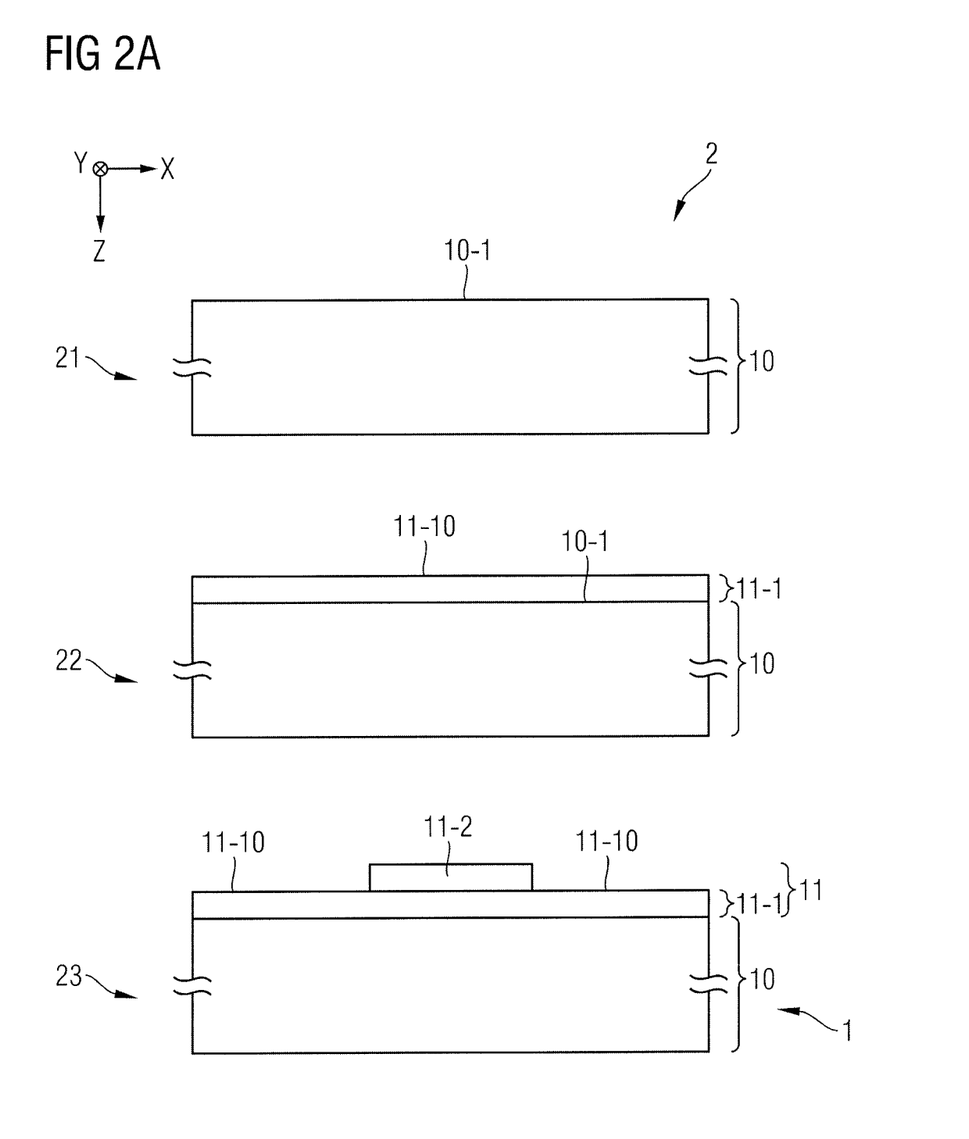
FIG. 2A-C schematically illustrate steps of a method of processing semiconductor device in accordance with some embodiments.
Figure 2B:
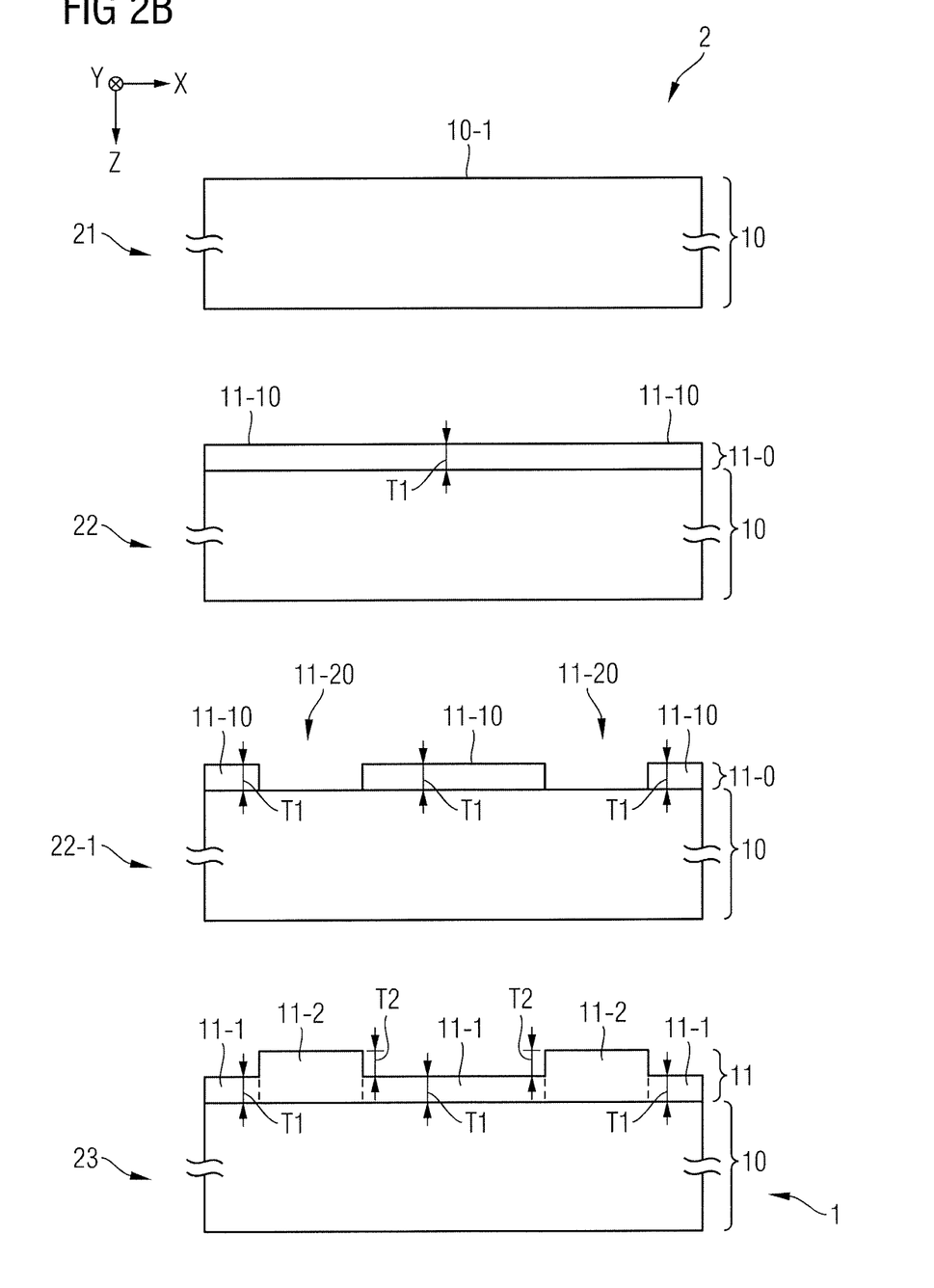
Figure 2C:
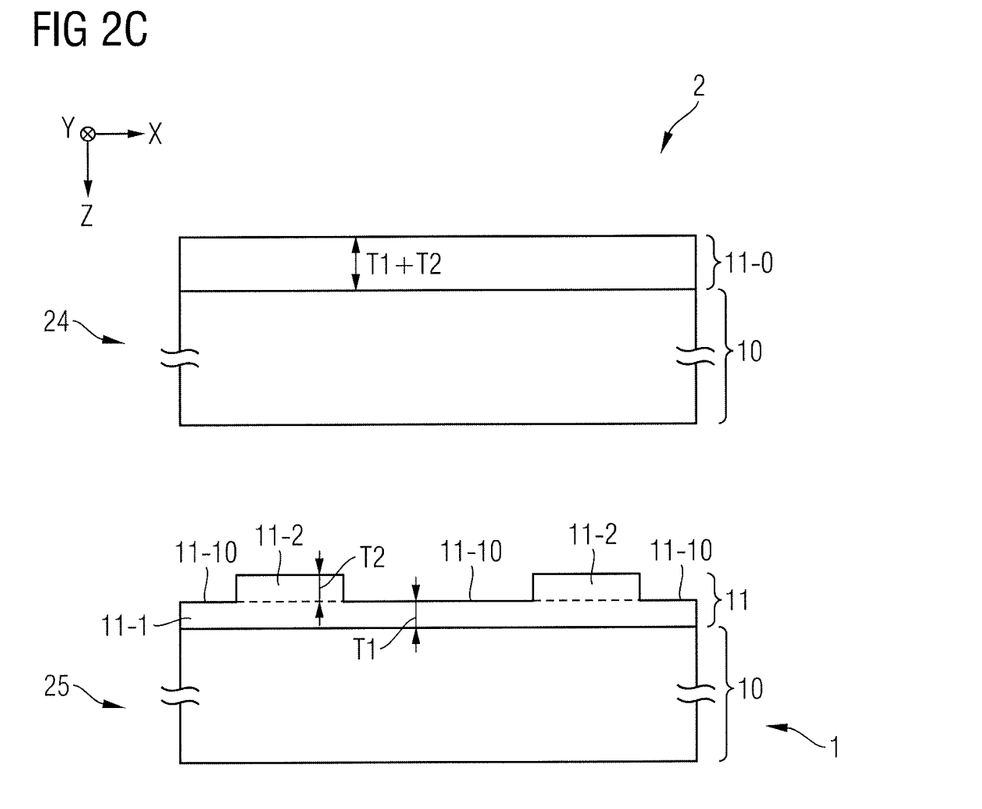

Regarding known in more detail FIG. 2A-C, some embodiments of processing a semiconductor device shall now be explained.

In accordance with the embodiment schematically illustrated in FIG. 2A, a semiconductor body 10 is provided (step 21), wherein the semiconductor 10 has a surface 10-1 and is configured to conduct a load current. Subsequently, a first load terminal 11 may be created that is arranged on top of the surface 10-1 and that is configured to receive the load current. Said creating of the first load terminal 11 may comprise depositing (step 22) a first material that includes a metal exhibiting a first level of impurity so as to form a contiguous metal layer 11-1 that is coupled to the semiconductor device 1. In a next step (step 23), a second material that includes the same metal exhibiting a second level of impurity is deposited so as to form at least one metal island 11-2 on top of and in contact with the contiguous metal layer 11-1. The created at least one metal island 11-2 may be configured to be contacted by an end 31 of a bond wire 3 and to receive at least a part of the load current by means of the bond wire 3, as has been explained with respect to FIG. 1 and FIG. 3 above.

Both depositing the first material (step 22) and depositing the second material (step 23) may include a lithographic processing step using one or more masks. Thus, both the metal layer 11-1 and the metal island 11-2 may be structured along at least one of the first lateral direction X and the second lateral direction Y.

Within the step of depositing the second material (step 23), a plurality of metal islands 11-2 can be created that may be distributed along the surface 11-10 of the contiguous metal layer 11-1 in accordance with a pattern structure, for example, a pattern structure that corresponds to source regions (not illustrated) that may be included in the semiconductor body 10.

Further, both depositing the first material (step 22) and depositing the second material (step 23) can include carrying out at least one of an electroplating processing step and a sputtering processing step.

Regarding the first and the second material, what has been stated above regarding the first and second substances or, respectively, the first and second level of impurities, may equally apply to the methods described above.

Regarding now a variant in accordance with FIG. 2B, instead of mounting the metal island 11-2 on top of the surface 11-10 of the contiguous metal layer 11-1, recesses 11-20 of a first metal layer 11-0 may be created (cf. step 22-1), e.g., by applying an etching step, so as to expose parts of the surface of the semiconductor body 10. Then, in a subsequent step, the metal islands 11-2 may be created at the recesses 11-20, i.e., at sections of the surface of the semiconductor body 10 that are not covered by the first layer 11-0. Also in accordance with this variant, in the outcome, the metal island 11-2 is arranged on top of and in contact with a contiguous metal layer 11-1, even though it has not deposited directly on the surface of the contiguous metal layer 11-1.

In accordance with a yet further variant that is schematically illustrated in FIG. 2C, a thick first metal layer 11-0 is deposited on the surface of the semiconductor body 10 (step 24). Then, the metal islands 11-2 may be formed a carrying out a masked etching processing step so as to remove only parts of the thick metal layer 11-0, thereby forming the contiguous metal layer 11-1 and the metal islands 11-2 arranged on top thereof (step 25).

In accordance with the embodiments described above with respect to FIG. 2A-C, it shall be understood that, once the semiconductor body 10 and the first load terminal 11, which may be formed at a front side of the semiconductor device 1, the back side of the semiconductor device 1 can be processed, wherein said processing may include forming the second load terminal 12, e.g., a back side metallization.

The embodiments described above include the recognition that it may sometimes be desirable to avoid damaging of a chip metallization during bonding. To this end, a chip metallization having locally reinforced regions may be provided. Sometimes, such reinforced regions may exhibit a different material as compared to the remaining chip metallization, wherein said different material may include at least of boron or phosphorous or a corresponding alloy. However, such additional materials, or, respectively, such additional material system within the chip construction may increase the total complexity of the chip construction.

Regarding again the damages, the bonding process can even damage the material of the semiconductor body, which may comprise, e.g., silicon (Si). For avoiding such and other damages, it is principally possible to use an entirely thicker chip metallization. However, using a chip metallization that exhibits an entirely increased thickness may cause other problems, such as processing of wavers exhibiting a comparatively strong waver bow.

In accordance with one or more embodiments, one or more of said metal islands are provided on top of the contiguous metal layer and only in those locally confined regions that are required for connection of bond wires. For example, by means of said metal islands, damages as mentioned above can be avoided, even though the semiconductor device is exposed a comparatively high bonding load and even though the remaining parts of the contiguous metal layer of not covered by metal island.

For examples, both the contiguous metal layer and the at least one metal island consist of copper. Thus, said metal islands do not introduce, in accordance with one or more embodiments, a new material, or, respectively a new metallization to the chip construction. For example, the metal islands can be formed in a same manner as the chip metallization, e.g., in the same manner as the source-pad. This may include carrying out an electro-chemical deposition processing step.

Further, by means of providing the metal islands only at the regions where the bonding wires are to be attached, the mean thickness or, respectively, an average thickness of the metallization of the first load terminal can be kept comparatively low, which may lead to a reduction of the wafer bow.

Features of further embodiments are defined in the dependent claims. The features of further embodiments and the features of the embodiments described above may be combined with each other for forming additional embodiments, as long as the features are not explicitly described as being alternative to each other.

In the above, embodiments pertaining to semiconductor devices, modules and to methods and systems for processing a semiconductor wafer were explained. For example, these semiconductor devices are based on silicon (Si). Accordingly, a monocrystalline semiconductor region or layer, e.g., the semiconductor region 10 of exemplary embodiments, can be a monocrystalline Si-region or Si-layer. In other embodiments, polycrystalline or amorphous silicon may be employed.

It should, however, be understood that the semiconductor regions 10 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A semiconductor device comprising:
 a semiconductor body coupled to a first load terminal and to a second load terminal and configured to carry a load current between the first load terminal and the second load terminal, the first load terminal comprising:
  a contiguous metal layer coupled to the semiconductor body; and
  at least two elevated metal islands spaced apart from each other, each metal island forming a bonding pad directly arranged on top of and in contact with the contiguous metal layer and configured to be directly contacted by an end of a bond wire and to receive at least a part of the load current via the bond wire,
 wherein each metal island establishes a mechanical reinforcement for the first load terminal,
 wherein the contiguous metal layer is thicker than each metal island,
 wherein the contiguous metal layer and each metal island comprise the same metal,
 wherein the metal in the contiguous metal layer comprises a first substance,
 wherein the first substance amounts to a material portion of at most 1% in the contiguous metal layer,
 wherein the metal in each metal island comprises a second substance, and
 wherein the second substance amounts to a material portion of at most 1% in each metal island, the second substance being different than the first substance.

2. The semiconductor device of claim 1, wherein the contiguous metal layer and each metal island form a monolithic metal region.

3. The semiconductor device of claim 1, wherein the contiguous metal layer is electrically connected to at least a section of the semiconductor body.

4. The semiconductor device of claim 1, wherein the contiguous metal layer exhibits a thickness of at least 10 µm along a vertical direction.

5. The semiconductor device of claim 1, wherein each metal island exhibits a thickness of at least 5 μm along a vertical direction.

6. The semiconductor device of claim 1, wherein each metal island extends for at least 100 μm along a first lateral direction and for at least 100 μm along a second lateral direction.

7. The semiconductor device of claim 6, wherein the contiguous metal layer extends for at least 400 μm along a first lateral direction and/or for at least 400 μm along a second lateral direction.

8. The semiconductor device of claim 1, wherein each metal island covers at least 5% and at most 60% of a surface of the contiguous metal layer.

9. The semiconductor device of claim 1, wherein the semiconductor body has a total extension along a vertical direction of less than 700 μm.

10. The semiconductor device of claim 1, wherein the metal is one of copper, silver, gold, palladium, zinc, nickel, or iron.

11. The semiconductor device of claim 1, wherein the contiguous metal layer is thicker along a vertical direction than each metal island.

12. The semiconductor device according to claim 1, wherein the semiconductor device is a vertical power semiconductor device.

13. The semiconductor device of claim 1, wherein the contiguous metal layer exhibits a thickness of at least 10 μm along a vertical direction, and wherein each metal island exhibits a thickness of at least 5 μm along a vertical direction.

14. A module comprising:
a semiconductor device comprising:
  a semiconductor body coupled to a first load terminal and to a second load terminal and configured to carry a load current between the first load terminal and the second load terminal, the first load terminal comprising:
    a contiguous metal layer coupled to the semiconductor body; and
    at least two elevated metal islands spaced apart from each other, each metal island forming a bonding pad directly arranged on top of and in contact with the contiguous metal layer and configured to be directly contacted by an end of a bond wire and to receive at least a part of the load current via the bond wire,
  wherein each metal island establishes a mechanical reinforcement for the first load terminal,
  wherein the contiguous metal layer is thicker than each metal island,
  wherein the contiguous metal layer and each metal island comprise the same metal,
  wherein the metal in the contiguous metal layer comprises a first substance,
  wherein the first substance amounts to a material portion of at most 1% in the contiguous metal layer,
  wherein the metal in each metal island comprises a second substance, and
  wherein the second substance amounts to a material portion of at most 1% in each metal island, the second substance being different than the first substance;
at least two bond wires; and
a packaging,
wherein the packaging at least partially surrounds the semiconductor device and comprises load current interfaces that are contacted to other ends of the at least two bond wires.

15. The module according to claim 14, wherein the second load terminal and the load current interfaces are located on the same side of the module.

16. The module according to claim 14, wherein the semiconductor device is a vertical power semiconductor device.

17. The module of claim 14, wherein the contiguous metal layer and each metal island form a monolithic metal region.

18. The module of claim 14, wherein the contiguous metal layer exhibits a thickness of at least 10 μm along a vertical direction, and wherein each metal island exhibits a thickness of at least 5 μm along a vertical direction.

19. The module of claim 14, wherein the metal is one of copper, silver, gold, palladium, zinc, nickel, or iron.

* * * * *